United States Patent [19]

Kiriseko

[11] Patent Number: 4,525,922
[45] Date of Patent: Jul. 2, 1985

[54] METHOD OF PRODUCING A SEMICONDUCTOR DEVICE

[75] Inventor: Tadashi Kiriseko, Kanagawa, Japan

[73] Assignee: Fujitsu Limited, Kawasaki, Japan

[21] Appl. No.: 544,263

[22] Filed: Oct. 21, 1983

[30] Foreign Application Priority Data

Oct. 22, 1982 [JP] Japan .................. 57-185508

[51] Int. Cl.$^3$ ................ H01L 21/22; H01L 21/265
[52] U.S. Cl. ................. 29/577 C; 29/576 B; 29/578; 148/1.5; 148/175; 148/187
[58] Field of Search ........... 29/577 C, 578, 576 B; 148/187, 175, 1.5

[56] References Cited

U.S. PATENT DOCUMENTS

| | | | |
|---|---|---|---|
| 4,233,337 | 11/1980 | Friedman et al. | 148/187 X |
| 4,243,435 | 1/1981 | Barile et al. | 148/1.5 |
| 4,377,031 | 3/1983 | Goto et al. | 148/187 X |
| 4,404,048 | 9/1983 | Vogelzang | 148/187 X |
| 4,408,387 | 11/1983 | Kiriseko | 148/187 X |
| 4,412,376 | 11/1983 | DeBar et al. | 148/1.5 X |
| 4,418,468 | 12/1983 | Vora et al. | 148/187 X |
| 4,452,645 | 6/1984 | Chu et al. | 148/187 X |

OTHER PUBLICATIONS

European Search Report, Berlin, 7-12-1983, Examiner C. S. Gibbs.
European EP-A-O 020 998 (IBM).
IBM Technical Disclosure Bulletin, vol. 22, No. 9, Feb. 1980, New York, T. H. Yeh "Self-Aligned Integrated NPN (vertical) and PNP (lateral) Structures", pp. 4047-4051.
IBM Technical Disclosure Bulletin, vol. 22, No. 4, Sep. 1979, New York, R. J. Ross, "Stable SBD for Nitride-passivated Processes Via Oxide Step Reduction, pp. 1403-1404.

Primary Examiner—George T. Ozaki
Attorney, Agent, or Firm—Staas & Halsey

[57] ABSTRACT

A method of producing a semiconductor device, including a bipolar transistor and a Schottky barrier diode (e.g., an SBD transistor), includes the steps of selectively etching an insulating layer formed on an N-type silicon epitaxial layer so as to form an emitter electrode contact window; and forming a polycrystalline silicon layer on the exposed portion of a P-type base region in the window. The method further includes the steps of introducing N-type impurities into the P-type base region through the polycrystalline silicon layer in the window, selectively etching the insulating layer so as to form a base electrode contact window and a contact window for the electrode of the SBD and carrying out a heat treatment for redistribution of the introduced impurities so as to form an emitter region. An emitter electrode is then formed on the polycrystalline silicon layer and the electrode of the SBD is formed directly on the silicon epitaxial layer.

9 Claims, 14 Drawing Figures

Fig. IA PRIOR ART
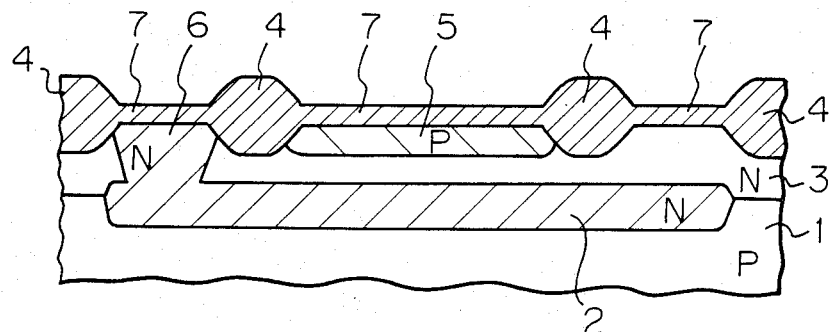
Fig. IB
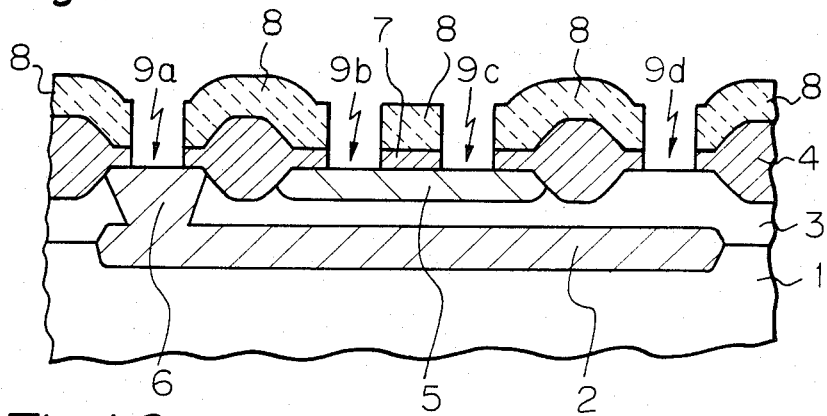
Fig. IC
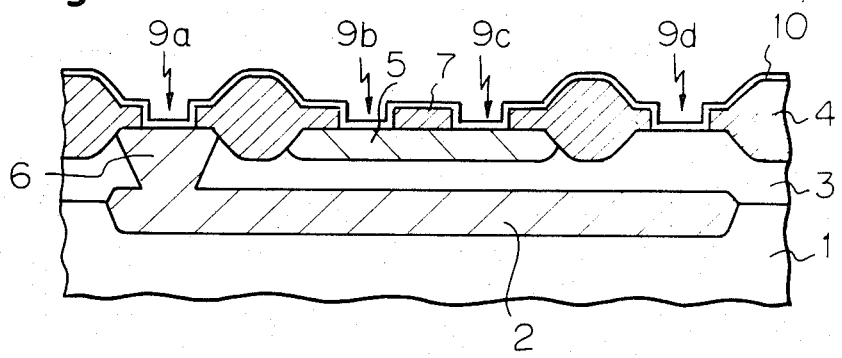

METHOD OF PRODUCING A SEMICONDUCTOR DEVICE

BACKGROUND OF THE INVENTION (1) Field of the Invention

The present invention relates to a semiconductor device, and more particularly to a method of producing a semiconductor device comprising bipolar transistors and Schottky barrier diodes (SBDs) formed in a semiconductor substrate.

(2) Description of the Prior Art

In a bipolar integrated circuit (IC) such as a transistor-transistor logic (TTL) circuit, in order to prevent a delay of the switching time due to the storage effect of minority carriers, an SBDTTL, wherein the SBD is clamped between the base and the collector of a bipolar transistor, is preferably used. In the production of a highly dense bipolar IC, a washed emitter process, wherein a window for impurity diffusion is also used as an emitter electrode contact window, is utilized for miniaturizing the bipolar transistor. The conventional washed emitter process comprises the steps of forming a window in an insulating layer covering a base region, forming an impurity-containing glass layer in the window, thermally diffusing the impurities of the glass layer into the base region so as to form an emitter region, washing the glass layer with a suitable etchant, and forming an emitter electrode. Improvements in the washed emitter process have been proposed in, for example, Japanese Examined Patent Publication (Kokoku) No. 54-7194 (published Apr. 4, 1979) and No. 55-24703 (published July 1, 1980). According to these publications, after the formation of a window in an insulating layer covering a base region, a polycrystalline silicon layer is formed in the window. Then a silicate glass layer containing highly concentrated impurities is selectively formed on the polycrystalline silicon layer above the window and is heated to diffuse the impurities into the base region through the polycrystalline silicon layer. After the glass layer is washed, an emitter electrode is formed on the polycrystalline silicon layer. However, in an SBD, if a polycrystalline silicon layer is present between a semiconductor layer and a metal electrode, a Schottky barrier cannot be perfectly formed.

Taking the above-mentioned prior art into consideration, a method of producing an SBD clamped transistor is proposed in Japanese Examined Patent Publication No. 55-24697 (published July 1, 1980). In this case, after the formation of all of the contact windows for the collector electrode, the base electrode, the emitter electrode and an electrode of the SBD in an insulating layer formed on a semiconductor layer, a thin silicon dioxide (SiO$_2$) layer is formed on at least the exposed portions of the semiconductor layer. The thin SiO$_2$ layer serves to prevent etching of the polycrystalline silicon. The thin SiO$_2$ layer is removed by etching all of it except the portion in the window for the SBD. A polycrystalline silicon layer is formed on the insulating layer, on the exposed portions of the semiconductor layer in the windows for the electrodes of the transistor, and on the thin SiO$_2$ layer in the window for the SBD. A silicate glass layer containing impurities is formed on the polycrystalline silicon layer and is selectively etched to remove a portion thereof above the window for the base electrode. The impurities are thermally diffused through the polycrystalline silicon layer by means of a heat treatment so as to form an emitter region. The silicate glass layer is washed and then the polycrystalline silicon layer and the thin SiO$_2$ layer are selectively etched to expose a portion of the semiconductor layer within the window for the SBD. A metal layer, e.g., an aluminum (Al) layer, is deposited and selectively etched so as to form the electrode of the SBD on the exposed semiconductor layer and the collector electrode, the base electrode and the emitter electrode on the polycrystalline silicon layer within the windows, respectively. However, the proposed method involves the formation of four photoresist layers having different patterns to form the windows and necessitates very careful etching of the thin SiO$_2$ layer. Thus, the production steps are relatively many and complicated and the production yield can easily vary.

SUMMARY OF THE INVENTION

An object of the present invention is to simplify the production of a semiconductor device which includes a bipolar transistor and an SBD formed in a semiconductor substrate, e.g., an SBD clamped transistor.

Another object of the present invention is to provide an improved method of producing the semiconductor device so as to increase the production yield.

These and other objects of the present invention are attained by providing a method of producing a semiconductor device which includes an SBD and a bipolar transistor which has an emitter region formed by the self-alignment thereof with an emitter electrode contact window and has an emitter electrode connected to the emitter region through a polycrystalline silicon layer. The method includes the steps of: (a) selectively etching an insulating layer which is formed on an N-type silicon layer provided with a P-type base region so as to form an emitter electrode contact window in which a portion of the P-type base region is exposed; (b) forming the polycrystalline silicon layer on at least the exposed portion of the P-type base region; (c) introducing N-type impurities into the P-type base region through the polycrystalline silicon layer in the emitter electrode contact window; (d) after the impurity-introducing step, selectively etching the insulating layer to form a base electrode contact window and a contact window for the electrode of the SBD, exposing a portion of the N-type silicon layer; and (e) carrying out a heat treatment for redistribution of the introduced N-type impurities so as to form an N-type emitter region.

BRIEF DESCRIPTION OF THE DRAWINGS

The present invention will be more apparent from the description of the preferred embodiments set forth below, with reference to the accompanying drawings, in which:

FIGS. 1A through 1H are schematic sectional views of a semiconductor device in various stages of production in accordance with a prior art technique.

DESCRIPTION OF THE PREFERRED EMBODIMENTS

Figure 1D:
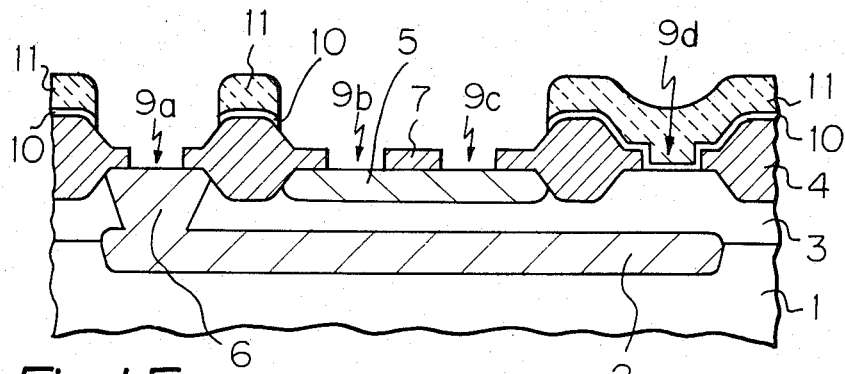

Before describing the preferred embodiments of the present invention, a prior art technique for the production of a semiconductor device comprising a bipolar transistor and an SBD is discussed.

As is illustrated in FIG. 1A, a semiconductor substrate comprises a P-type silicon single crystalline substrate (e.g., wafer) 1 having an N+-type buried layer 2 and an N-type silicon epitaxial layer 3. After the selective formation of a thick insulating layer (e.g., $SiO_2$ layer) 4 on the silicon epitaxial layer 3, a P-type base region 5 and an N+-type collector connecting region 6 are formed by a conventional method. An insulating layer 7, for example, comprises a thin $SiO_2$ layer formed by a thermal oxidation method and an $SiO_2$ layer formed by a chemical vapor deposition (CVD) method on the thin $SiO_2$ layer. Thus, the thick insulating layer 4 comprises a thick $SiO_2$ layer formed by a thermal oxidation method, and the CVD-$SiO_2$ layer 7 formed thereon.

As is illustrated in FIG. 1B, a first photoresist layer 8 is applied on the thick insulating layer 4 and the insulating layer 7, exposed, and developed so as to form predetermined openings therein. Using the photoresist layer 8 as a mask, the insulating layer 7 is selectively etched to form a collector electrode contact window 9a, a base electrode contact window 9b, an emitter electrode contact window 9c, and an electrode contact window 9d for an SBD.

As is illustrated in FIG. 1c, after the photoresist layer 8 is removed with a solvent, a thin $SiO_2$ layer 10 is formed, by a CVD method, on the entire exposed surface. It is possible to form the thin $SiO_2$ layer 10 by thermally oxidizing the exposed portions of the silicon epitaxial layer 3.

As illustrated in FIG. 1D, a second photoresist layer 11 is applied on the thin $SiO_2$ layer 10, exposed, and developed so as to remove all of it except portions above the thick insulating layer 4 and a portion of the thin CVD-$SiO_2$ layer 10 corresponding to an SBD. Using the photoresist layer 11 as a mask, the exposed thin CVD-$SiO_2$ layer 10 is removed by etching. It is necessary to perform the etching step carefully (i.e., under strict control) since the material of the insulating layer 7 under the thin CVD-$SiO_2$ layer 10 is $SiO_2$. If the insulating layer 7 is excessively etched, the dimensions of the windows 9a, 9b and 9c are undesirably increased. If the insulating layer 7 is completely etched, an emitter-base short circuit occurs.

Figure 1E:
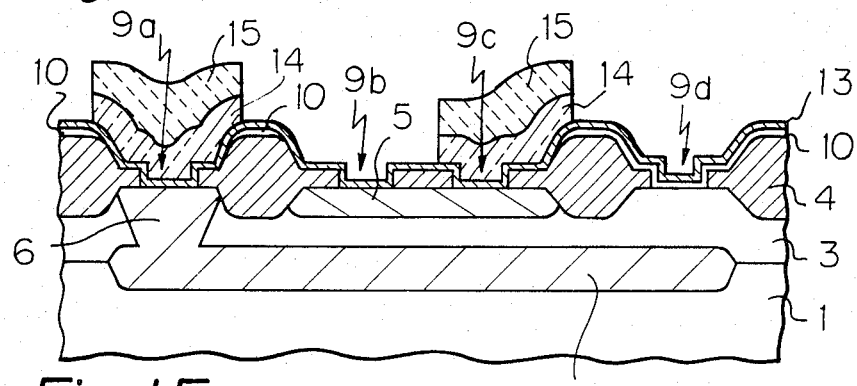

After the removal of the photoresist layer 11, as is illustrated in FIG. 1E, a polycrystalline silicon layer 13 is formed on the entire exposed surface. Then a phosphosilicate glass (PSG) layer 14, as an impurity-containing glass layer, is formed on the polycrystalline silicon layer 13 by a CVD method. A third photoresist layer 15 is applied, exposed, and developed so as to leave portions thereof above the collector electrode contact window 9a and the emitter electrode contact window 9c. Using the photoresist layer 15 as a mask, the PSG layer 14 is selectively etched. Thus, the portions of the PSG layer 14 under the photoresist layer 15 remain on the polycrystalline silicon layer 13 above the windows 9a and 9c.

Figure 1F:
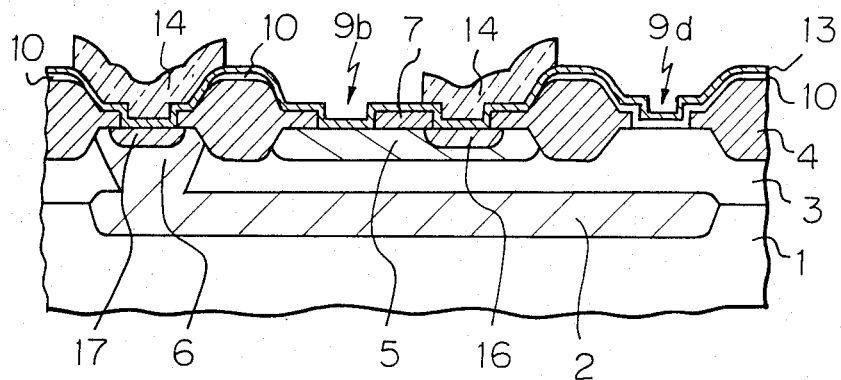

As is illustrated in FIG. 1F, after the photoresist layer 15 is removed, the obtained device is heated so as to diffuse the phosphorus (i.e., N-type impurities) into the P-type base region 5 and the N+-type collector-connecting region 6 from the PSG layer 14 through the polycrystalline silicon layer 13. As a result, an N+-type emitter region 16 is formed in the P-type base region 5, and simultaneously an N++-type collector contact region 17 is formed in the N+-type collector connecting region 6.

Figure 1G:
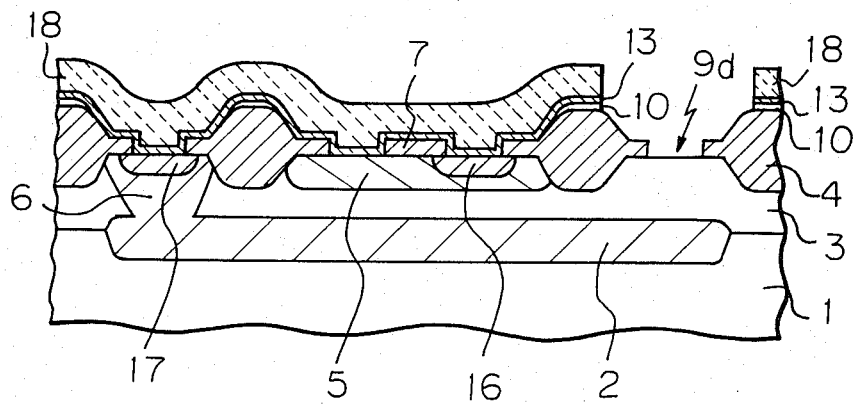

Next, the PSG layer 14 is washed. As is illustrated in FIG. 1G, a fourth photoresist layer 18 is applied on the polycrystalline silicon layer 13, exposed and developed to form an opening above the window 9d for the electrode of the SBD. Using the photoresist layer 18 as a mask, the polycrystalline silicon layer 13 is selectively etched with a suitable etchant which cannot etch the thin CVD-$SiO_2$ layer 10 or which can etch it only at a very low etching rate. Subsequently, the thin CVD-$SiO_2$ layer 10 is selectively etched with another etchant so as to expose a portion of the N-type silicon epitaxial layer 3 in the window 9d. If there is no thin CVD-$SiO_2$ layer between the polycrystalline silicon layer 13 and the silicon epitaxial layer 3, when the polycrystalline silicon layer 13 is removed by etching, the silicon epitaxial layer 3 is also etched, with the result that the surface thereof is roughened.

Figure 1H:
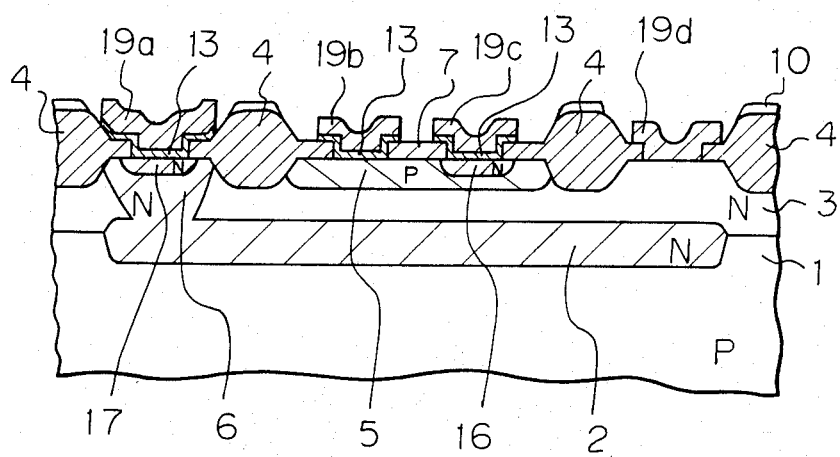

As is illustrated in FIG. 1H, after removal of the photoresist layer 18, an Al layer is formed on the entire exposed surface by a vacuum deposition method or a sputtering method and is patterned (i.e., selectively etched) by a conventional method (e.g., a photolithographic method) so that a collector electrode 19a, a base electrode 19b, and an emitter electrode 19c are formed on the polycrystalline silicon layer 13 in the windows 9a, 9b and 9c, respectively, and the electrode 19d of the SBD is formed directly on the exposed silicon epitaxial layer 3 in the window 9d. The Al electrode 19d and the silicon epitaxial layer 3 form a Schottky barrier at the interface thereof. Using the Al electrodes 19a, 19b, 19c and 19d as masks, the polycrystalline silicon layer 13 is selectively etched.

Thus, an NPN-type bipolar transistor and an SBD are produced. The above-method of producing the semiconductor device has the above-mentioned disadvantages.

Referring to FIGS. 2A through 2F, a method of producing a semiconductor device comprising a bipolar transistor and an SBD in accordance with a preferred embodiment of the present invention is now explained.

Figure 2A:
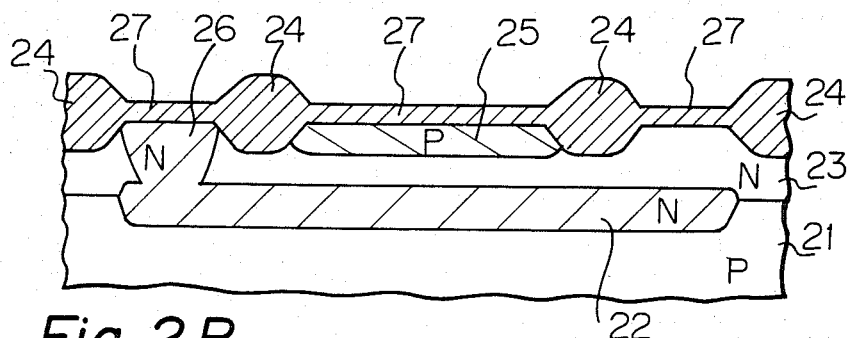
FIGS. 2A through 2F are schematic sectional views of a semiconductor device in various stages of production according to the method of the present invention.

As is illustrated in FIG. 2A, a semiconductor substrate comprises a P-type silicon single crystalline substrate 21 having an N+-type buried layer 22 and an N-type silicon epitaxial layer 23. A thick insulating layer (i.e., a field oxide layer) 24 having a thickness of, e.g., approximately 800 nm is formed by selectively thermally oxidizing the silicon epitaxial layer 23. Then the non-oxidized portion of the silicon epitaxial layer 23 is exposed and thermally oxidized so as to form a thin $SiO_2$ layer having a thickness of, e.g., approximately 100 nm. A P-type base region 25, an N+-type collector-connecting region 26, and a P-type semiconductor resistor (not shown) are formed by using an ion-implantation technique. Next, a $SiO_2$ layer having a thickness of, e.g., from 300 to 400 nm is formed on the entire exposed surface (i.e., on the thick insulating layer 24 and the thin $SiO_2$ layer) by a CVD method. Therefore, an insulating layer 27 consists of the thin $SiO_2$ layer and the CVD-$SiO_2$ layer, and the thick insulating layer 24 consists of the field oxide layer and the CVD-$SiO_2$ layer. Instead of forming a CVD-$SiO_2$ layer, it is possible to form the insulating layer 27 by further thermally oxidizing the silicon epitaxial layer 23 after the ion-implantation step.

Figure 2B:
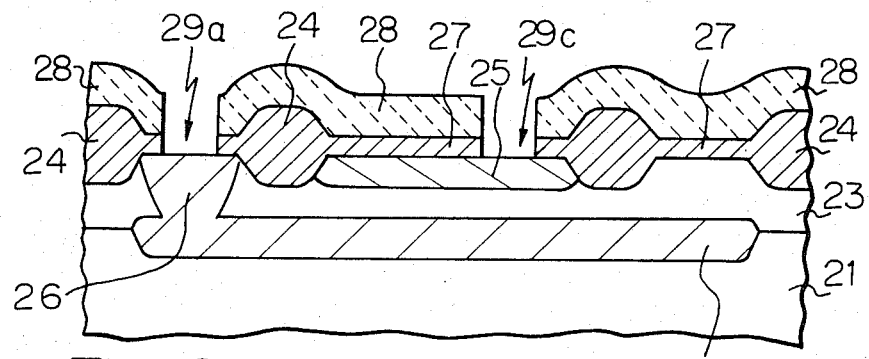

As is illustrated in FIG. 2B, a first resist layer 28 is applied on the exposed surface, exposed, and developed so as to form two openings. The exposure is carried out with an electron beam or by passing light of a predetermined pattern through a photomask. Using the resist layer 28 as a mask, the insulating (SiO$_2$) layer 27 is selectively etched by a suitable etching method to form a collector electrode contact window 29a in which a portion of the collector-connecting region 26 is exposed and an emitter electrode contact window 29c in which a portion of the base region 25 is exposed. For example, the etching is carried out by using a reactive ion etching method (etchant gas: CF$_4$, pressure: 0.01 to 1 Torr, electrical power per unit area: 0.2 to 0.3 W/cm$^2$, power source frequency: 13.56 MH$_2$).

Figure 2C:
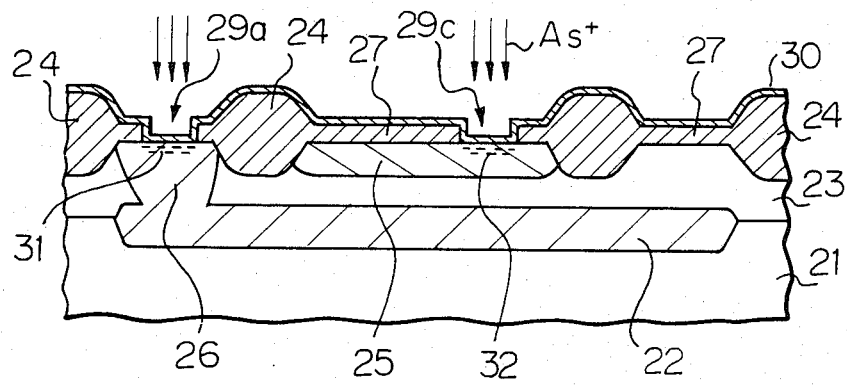

Next, the resist layer 28 is removed with a suitable solvent. As illustrated in FIG. 2C, a polycrystalline silicon layer 30 having a thickness of, e.g., approximately 100 nm is formed on the thick insulating layer 24, the insulating layer 27, and the exposed portions of the silicon epitaxial layer 23 in the windows 29a and 29c by a CVD method. Using the insulating layer 27 as a mask, N-type impurities (e.g., arsenic) are introduced into the silicon epitaxial layer 23 through the polycrystalline silicon layer 30 in the windows 29a and 29c by an ion-implantation method so that an impurity-introduced area 31 and an impurity-introduced area 32 formed by the self-alignment thereof with the windows 29a and 29c in the N-type collector-connecting region 26 and the P-type base region 25, respectively. Arsenic ion-implantation, for example, is carried out at an ion energy of 60 KeV, and a dose of 5×10$^{15}$ atom/cm$^2$. It is possible to use phosphorus, and antimony as N-type impurities instead of arsenic.

Figure 2D:
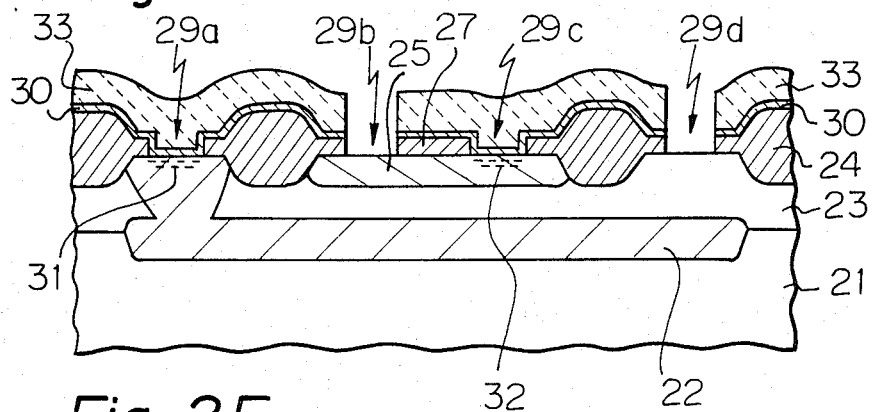

As is illustrated in FIG. 2D, a second resist layer 33 is applied on the exposed surface, is exposed, and is developed so as to form predetermined openings. Using the resist layer 33 as a mask, the polycrystalline silicon layer 30 and the insulating layer 27 are selectively etched to form a base electrode contact window 29b, an electrode contact window 29d, and two electrode contact windows (not shown) for the semiconductor resistor. In this etching step, for example, the polycrystalline silicon layer 30 is etched by a reactive ion etching method (etchant gas: CF$_4$+a certain percentage of O$_2$, pressure: 0.01 to 1 Torr, electrical power per unit area: 0.2 to 0.3 W/cm$^2$), and, subsequently the insulating (SiO$_2$) layer 27 is etched under the above-mentioned conditions. Thus, in the window 29b, another portion of the base region 25 is exposed, and in the window 29d, a portion of the silicon epitaxial layer 23 is exposed.

Figure 2E:
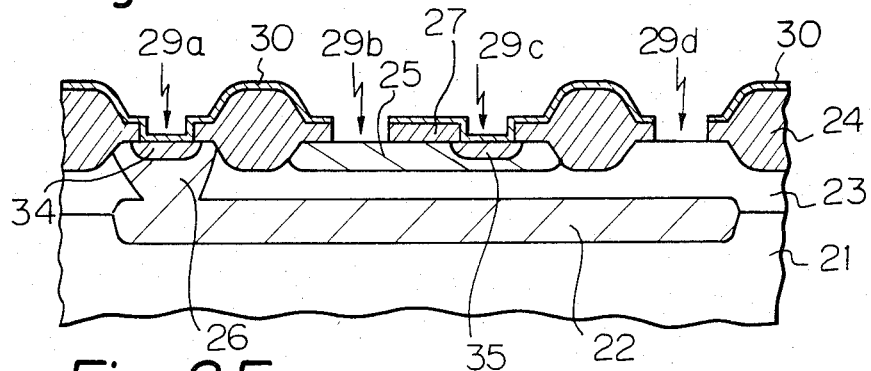

As is illustrated in FIG. 2E, the second resist layer 33 is removed. The obtained device is heated (i.e., annealed) at a predetermined temperature of, e.g., 1000° C., so as to redistribute and activate the arsenic (N-type impurities) of the impurity-introduced areas 31 and 32. As a result, an N$^{++}$-type collector contact region 34 is formed in the N$^+$-type collector connecting region 26, and, simultaneously an N$^+$-type emitter region 35 is formed in the P-type base region 25. At this stage, it is possible to perform property tests with probes.

Figure 2F:
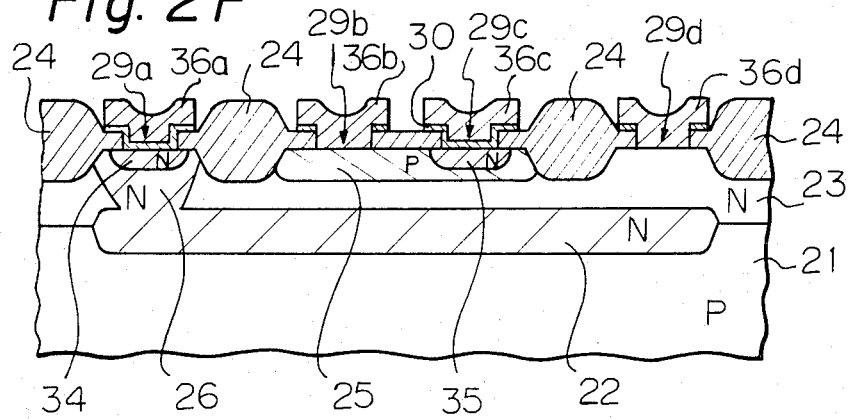

Next, as is illustrated in FIG. 2F, an Al layer is formed on the entire exposed surface by a vacuum deposition method or a sputtering method and is patterned (i.e., selectively etched) by a conventional method so as to form a collector electrode 36a, a base electrode 36b, an emitter electrode 36c, an electrode 36d of the SBD, and two electrodes (not shown) of the semiconductor resistor. The collector electrode 36a and the emitter electrode 36c are formed on the polycrystalline silicon layer 30 in the windows 29a and 29c, respectively. The base electrode 36b and the electrode 36d of the SBD are formed directly on the N-type silicon epitaxial layer 23 in the windows 29b and 29d, respectively. The Al electrode 36d comes into contact with the N-type silicon epitaxial layer 23 to form a Schottky barrier at the interface. It is possible to use a metal, Pt silicide or titanium instead of Al for forming a Schottky barrier. Using the Al electrodes 36a, 36b, 36c and 36d as masks, polycrystalline silicon layer 30 is selectively etched. For example, the Al layer can be etched by a reactive ion etching method using chlorine gas, boron trichloride gas or carbon tetrachloride gas as an etchant.

Thereafter a protecting insulating layer (not shown) may be formed on the entire exposed surface of the obtained device. Thus a semiconductor device comprising an NPN-type bipolar transistor and a SBD is produced.

According to the present invention, two resist layers are formed so as to form all of the windows. Thus, the number of steps in the formation of a resist layer is less than that in the above-mentioned prior art case, thereby simplifying production of the semiconductor device as compared with the prior art case. Furthermore, since the method of the present invention does not require careful etching of a thin CVD-SiO$_2$ layer so as to form windows for a bipolar transistor, a stable, high production yield can be attained.

It will be obvious that the present invention is not restricted to the above-mentioned embodiments and that many variations are possible for persons skilled in the art without departing from the scope of the invention.

I claim:

1. A method of producing a semiconductor device comprising a Schottky barrier diode and a bipolar transistor formed in a semiconductor substrate having an N-type silicon layer formed on the semiconductor substrate and having a P-type base region formed in the N-type silicon layer, the bipolar transistor having an emitter region formed by self-alignment with an emitter electrode contact window and having an emitter electrode connected to the emitter region through a polycrystalline silicon layer formed on the P-type base region, said method comprising the steps of:
   (a) selectively etching an insulating layer which is formed on the N-type silicon layer so as to form the emitter electrode contact window in which a portion of the P-type base region is exposed;
   (b) forming the polycrystalline silicon layer on at least the exposed portion of the P-type base region formed on the emitter electrode contact window;
   (c) introducing N-type impurities into the P-type base region through the polycrystalline silicon layer formed on the emitter electrode contact window; and
   (d) defining a base electrode contact window after said step (c) of introducing N-type impurities, in which a portion of the P-type base region is exposed, and defining a contact window for the electrode of the Schottky barrier diode in which a portion of the N-type silicon layer is exposed, by selectively etching through the polycrystalline silicon layer and the insulating layer using a resist layer as a mask.

2. A method according to claim 1, wherein said etching step (a) comprises the substep of etching the insulating layer to form a collector electrode contact window in which a portion of the N-type silicon layer is exposed, wherein said forming step (b) comprises the substep of forming the polycrystalline silicon layer on the exposed portion of the N-type silicon layer, and wherein said impurity introducing step (c) comprises the substep of introducing the N-type impurities into the N-type silicon layer through the polycrystalline silicon layer formed on the collector electrode contact window.

3. A method according to claim 1, further comprising a step (e) which comprises carrying out a heat treatment for redistribution of the N-type impurities so as to form an N-type emitter region.

4. A method according to claim 3, further comprising the step (f), after said heat-treating step (e), of forming, from a metal, an emitter electrode, a base electrode, a collector electrode and a Schottky barrier diode electrode.

5. A method according to claim 4, wherein said step (f) comprises forming the emitter, base, collector and Schottky barrier diode electrodes from a metal selected from the group consisting of aluminum, platinum silicide and titanium.

6. A method according to claim 1, wherein said impurity introducing step (c) comprises introducing impurities using an ion implantation.

7. A method according to claim 1, wherein said step (c) comprises introducing N-type impurities selected from the group consisting of arsenic, phosphorus and antimony.

8. A method according to claim 1, further comprising forming the semiconductor substrate of a P-type silicon single crystalline substrate and forming the N-type silicon layer thereon.

9. A method according to claim 1, wherein said step (a) comprises forming the insulating layer of silicon dioxide.

* * * * *

UNITED STATES PATENT AND TRADEMARK OFFICE
CERTIFICATE OF CORRECTION

PATENT NO. : 4,525,922
DATED : JULY 2, 1985
INVENTOR(S) : TADASHI KIRISEKO

It is certified that error appears in the above-identified patent and that said Letters Patent is hereby corrected as shown below:

Col. 8, line 6, "implantation." should be

--implantation method.--.

Signed and Sealed this

Fifteenth Day of October 1985

[SEAL]

Attest:

Attesting Officer

DONALD J. QUIGG

Commissioner of Patents and Trademarks—Designate